United States Patent [19]

Fulcher

[11] Patent Number: 6,008,534
[45] Date of Patent: Dec. 28, 1999

[54] INTEGRATED CIRCUIT PACKAGE HAVING SIGNAL TRACES INTERPOSED BETWEEN POWER AND GROUND CONDUCTORS IN ORDER TO FORM STRIPLINE TRANSMISSION LINES

[75] Inventor: Edwin M. Fulcher, Palo Alto, Calif.

[73] Assignee: LSI Logic Corporation, Milpitas, Calif.

[21] Appl. No.: 09/006,813

[22] Filed: Jan. 14, 1998

[51] Int. Cl.[6] .......................... H01L 23/52; H01L 23/48; H01L 29/40
[52] U.S. Cl. .......................... 257/691; 257/778; 257/690; 257/693
[58] Field of Search ...................... 257/691, 690, 257/693, 697, 698, 700, 702, 703, 699, 701, 662, 664, 778

[56] References Cited

U.S. PATENT DOCUMENTS

| | | | |
|---|---|---|---|
| 5,708,296 | 1/1998 | Bhansali | 257/698 |
| 5,714,801 | 2/1998 | Yano et al. | 257/691 |
| 5,763,947 | 6/1998 | Bartley | 257/701 |
| 5,847,936 | 12/1998 | Forehand et al. | 361/794 |
| 5,898,217 | 4/1999 | Johnston | 257/691 |

*Primary Examiner*—Mahshid Saadat
*Assistant Examiner*—Jhihan B. Clark

[57] ABSTRACT

A semiconductor device package is presented having signal traces interposed between power and ground conductors in order to form stripline transmission lines. The semiconductor device package includes a substrate having a die area defined upon an upper surface. The die area is dimensioned to receive the integrated circuit. A first planar conductive layer formed upon the upper surface includes a first set of bonding pads and a set of conductive traces. Members of the first set of bonding pads are arranged upon the upper surface proximate the die area, and are used to make electrical connections to the integrated circuit. Members of the set of conductive traces are connected between one of two polarities of a power supply and corresponding members of the first set of bonding pads, and function as reference planes for underlying signal traces. A second planar conductive layer is positioned between the first planar conductive layer and an underside surface of the substrate. The second conductive layer is connected to the other of the two polarities of the power supply, and also functions as a reference plane for signal traces within the substrate. A planar conductive signal layer is interposed between the first and second conductive layers and patterned to form a set of signal traces. The signal traces form stripline transmission lines which are highly desirable in high frequency applications as their impedances are highly predictable and controllable.

24 Claims, 3 Drawing Sheets

INTEGRATED CIRCUIT PACKAGE HAVING SIGNAL TRACES INTERPOSED BETWEEN POWER AND GROUND CONDUCTORS IN ORDER TO FORM STRIPLINE TRANSMISSION LINES

BACKGROUND OF THE INVENTION

1. Field of Invention

This invention relates to semiconductor device packages and more particularly to device packages having signal traces connecting input/output (I/O) pads of an integrated circuit to device package terminals.

2. Description of Related Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit (i.e., "chip") is typically secured within a protective semiconductor device package. Each I/O pad of the chip is then connected to one or more terminals of the device package. The terminals of a device packages are typically arranged about the periphery of the package. The I/O pads of the chip are electrically connected to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Grid array semiconductor device packages have terminals arranged in a two-dimensional array across an underside surface of the device package. As a result, the physical dimensions of grid array device packages having hundreds of terminals are much smaller than their peripheral-terminal counterparts. Such smaller packages are highly desirable in portable device applications such as laptop and palmtop computers and handheld communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array ("BGA") device package. A BGA device includes a chip mounted upon a larger substrate made of, for example, fiberglass-epoxy printed circuit board material or a ceramic material (e.g., aluminum oxide, alumina, $Al_2O_3$, or aluminum nitride, AlN). The substrate includes two sets of bonding pads: a first set adjacent to the chip and a second set arranged in a two-dimensional array across the underside surface of the device package. Members of the second set of bonding pads function as device package terminals, and are coated with solder. The resulting solder balls on the underside of the BGA device package allow the device to be surface mounted to an ordinary PCB. The I/O pads of the chip are typically connected to corresponding members of the first set of bonding pads. Many BGA device packages have die areas dimensioned to receive integrated circuit chips and use established wire bonding techniques to electrically connect the I/O pads of the chips to corresponding flat metal "bonding fingers" adjacent to the die areas. During wire bonding, the I/O pads of the chip are electrically connected to corresponding bonding fingers by fine metal bonding wires. The substrate includes one or more layers of signal lines (i.e., signal traces or interconnects) which connect bonding fingers to corresponding members of the second set of bonding pads. During PCB assembly, the solder balls are placed in physical contact with corresponding bonding pads of the PCB. The solder balls are then heated long enough for the solder to flow. When the solder cools, the bonding pads on the underside of the chip are electrically and mechanically coupled to the bonding pads of the PCB.

The controlled collapse chip connection ("C4") is a well known alternate method of attaching an integrated circuit chip directly to a device package substrate, and is commonly referred to as the "flip chip" method. In preparation for C4 attachment, the I/O pads of the chip are arranged in a two-dimensional array upon an underside of the chip, and a corresponding set of bonding pads are formed upon an upper surface of the device package substrate. A solder bump is formed upon each of the I/O pads of the chip. During C4 attachment of the chip to the device package substrate, the solder bumps are placed in physical contact with the bonding pads of the device package substrate. The solder bumps are then heated long enough for the solder to flow. When the solder cools, the I/O pads of the chip are electrically and mechanically coupled to the bonding pads of the device package substrate. After the chip is attached to the device package substrate, the region between the chip and the device package substrate is filled with an "underfill" material which encapsulates the C4 connections and provides other mechanical advantages.

When the propagation delays of signals along the lengths of semiconductor device package signal traces exceed about one-quarter of the signal rise times, the signal traces begin to behave like transmission lines. The distances between conductors and the electrical properties of the dielectric material providing isolation become major factors in determining the impedances of the signal paths. Impedance changes along the lengths of the signal paths cause signal reflections at high frequencies which may in turn cause data transmission errors. Reliable operation of packaged semiconductor devices at high frequencies (i.e., at signal frequencies where propagation delays of signals along the lengths of the signal traces are greater than about one-quarter of the signal rise times) thus requires signal traces having uniform impedances.

It would be beneficial to have a semiconductor device package having signal traces which present uniform impedances along their entire lengths. Such a semiconductor device package would substantially reduce signal reflections at high frequencies along with resultant data transmission errors, thereby improving the high frequency performance of the semiconductor device package.

SUMMARY OF THE INVENTION

The problems outlined above are in large part solved by a semiconductor device package having signal traces interposed between power and ground conductors in order to form stripline transmission lines. The semiconductor device package is intended for housing an integrated circuit, and includes a substrate having a die area defined upon an upper surface of the substrate. The die area is dimensioned to receive the integrated circuit. A first planar conductive layer formed upon the upper surface includes a first set of bonding pads and a set of conductive traces. Members of the first set of bonding pads are arranged upon the upper surface proximate the die area, and are used to make electrical connections to the integrated circuit. Members of the set of conductive traces are connected between one of at least two polarities of a source of electrical power and corresponding members of the first set of bonding pads, and function as reference planes for underlying signal traces.

The substrate also includes a second planar conductive layer positioned between the first planar conductive layer and an underside surface of the substrate. The second conductive layer is connected to another of the at least two polarities of the source of electrical power, and also functions as a reference plane for signal traces within the substrate. The substrate also includes a planar conductive signal layer interposed between the first and second conductive layers and patterned to form a set of signal traces. The signal traces are positioned between the conductive traces of the first conductive layer and the second conductive layer such that the signal traces form stripline transmission lines. The signal traces are electrically isolated from the conductive traces of the first conductive layer and from the second conductive layer by layers of dielectric material within the substrate (e.g., an epoxy, ceramic, or polyimide material). Such stripline transmission lines are highly desirable in high frequency applications (i.e., at signal frequencies where the propagation delays of signals along the lengths of the signal traces are greater than about one-quarter of the signal rise times) as their impedances are highly predictable and controllable.

The substrate also includes a second set of bonding pads arranged upon an underside surface of the substrate. Members of the second set of bonding pads function as device terminals of the semiconductor device package. Members of the second set of bonding pads may be coated with solder, forming solder balls. Vertical conductors (i.e., vias) within the substrate connect members of the first set of bonding pads to corresponding signal traces and the signal traces to corresponding members of the second set of bonding pads such that signal paths are formed between corresponding members of the first and second sets of bonding pads.

A semiconductor device in accordance with the present invention includes an integrated circuit mounted to the semiconductor device package described above. The integrated circuit includes at least one electronic device formed upon a monolithic semiconductor substrate. In one embodiment, the integrated circuit has multiple input/output (I/O) pads arranged upon an underside surface. In this case, the members of the first set of bonding pads of the substrate are arranged within the die area, and the I/O pads of the integrated circuit are configured to align with corresponding members of the first set of bonding pads. The I/O pads of the integrated circuit are electrically connected to corresponding members of the first set of bonding pads using a C4 technique. In other embodiments, the I/O pads of the integrated circuit may be arranged about the periphery of an upper surface of the integrated circuit. In this case, the members of the first set of bonding pads of the substrate are arranged about the die area, and an underside surface of the integrated circuit is attached to the upper surface of the substrate within the die area. The I/O pads of the integrated circuit are electrically connected to corresponding members of the first set of bonding pads by bonding wires using a wire bonding technique.

BRIEF DESCRIPTION OF THE DRAWINGS

Other objects and advantages of the invention will become apparent upon reading the following detailed description and upon reference to the accompanying drawings in which.

Figure 1:
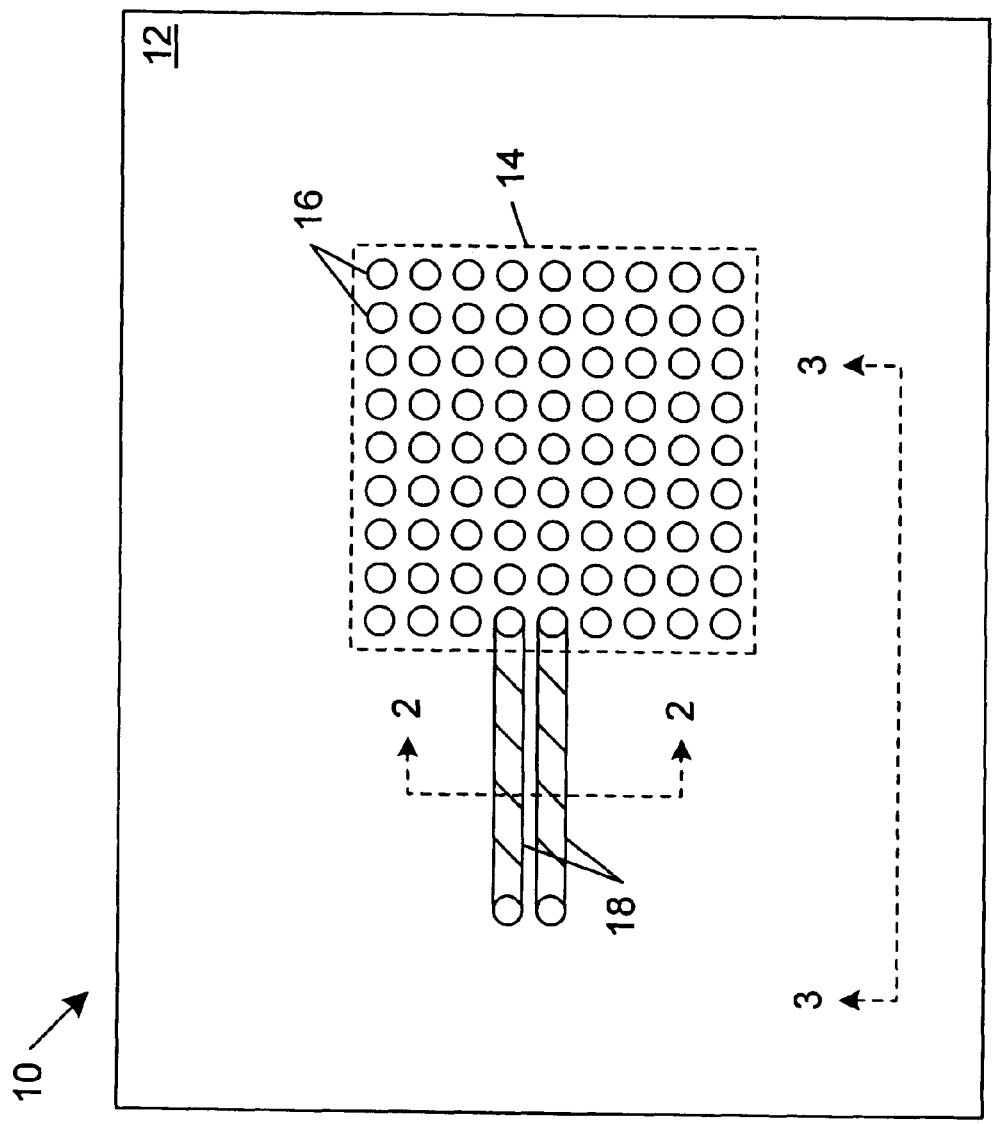
FIG. 1 is a top plan view of one embodiment of a semiconductor device package of the present invention, wherein the semiconductor device package includes a substrate having a first planar layer of an electrically conductive material formed upon an upper surface and patterned to form a first set of bonding pads and a set of conductive traces, and wherein members of the set of conductive traces function as reference planes for underlying signal traces.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 1 is a top plan view of one embodiment of a semiconductor device package 10 of the present invention. Semiconductor device 10 is for housing an integrated circuit, and includes a substrate 12 having opposed planar upper and underside surfaces. Substrate 12 is preferably substantially fiberglass-epoxy printed circuit board material. Alternately, substrate 12 may substantially be, for example, a ceramic material (e.g., aluminum oxide or aluminum nitride). Further, substrate 12 may substantially be, for example, an epoxy or polyimide material. Substrate 12 includes a die area 14 defined upon the upper surface and dimensioned to receive the integrated circuit. Die area 14 is preferably substantially in the center of the upper surface.

Substrate 12 also includes a first planar layer of an electrically conductive material (e.g., copper or aluminum) formed upon the upper surface. The first planar conductive layer is patterned to form a first set of bonding pads 16 and a set of conductive traces 18 upon the upper surface. Members of the first set of bonding pads are arranged upon the upper surface and proximate die area 14, and are used to form electrical connections to input/output (I/O) pads of the integrated circuit.

In the embodiment of FIG. 1, members of the first set of bonding pads 16 are arranged within the die area for controlled collapse chip connection (C4) or "flip chip" connection to corresponding I/O pads of the integrated circuit as described above. In this case, members of the first set of bonding pads 16 are typically arranged in a two-dimensional array within die area 14. Members of the first set of bonding pads 16 have substantially the same lateral dimensions (i.e., are approximately the same size) as the I/O pads of the integrated circuit and are configured to vertically align with the I/O pads of the integrated circuit.

Alternately, members of the first set of bonding pads 16 may be arranged about die area 14. An underside surface of the integrated circuit may be attached to the upper surface of substrate 12 within die area 14, and the I/0 pads of the integrated circuit may be attached to corresponding members of the first set of bonding pads 16 by bonding wires using a wire bonding technique. In this case, the I/0 pads of the integrated circuit are typically arranged about the periphery of an upper surface of the integrated circuit.

Members of the set of conductive traces 18 are connected between one of two polarities of a source of electrical power (e.g., a positive voltage or a ground potential) and corresponding members of the first set of bonding pads 16. Members of the set of conductive traces 18 not only supply electrical power to the integrated circuit during operation, they are also used to form "stripline" transmission lines within substrate 12 as will be described in detail below. Stripline transmission lines consist of one or more signal traces laterally spaced from one another and centered vertically between two electrically conductive planes. The impedances of stripline transmission lines are highly predictable and controllable.

Figure 2:
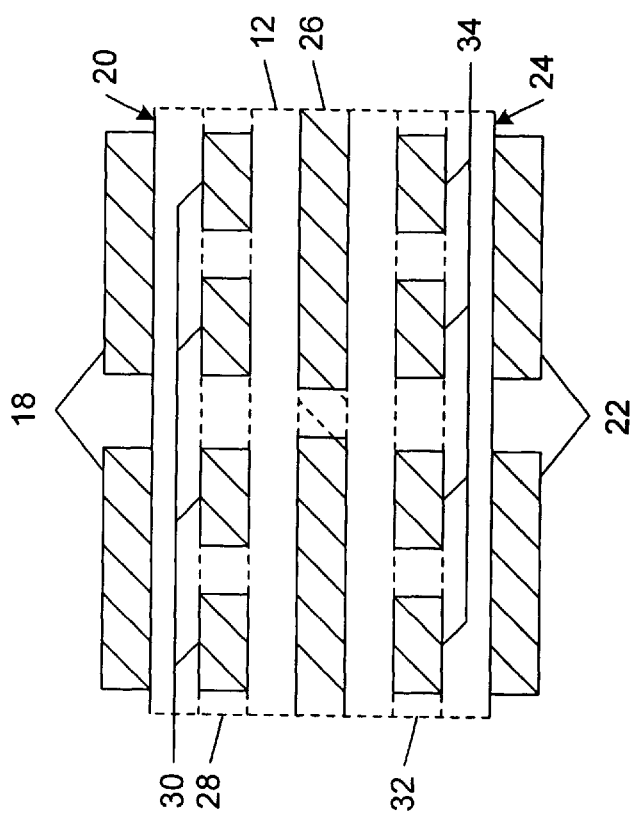
FIG. 2 is a first sectional view of the substrate as indicated in FIG. 1 illustrating a cross-sectional view of stripline transmission lines formed within the substrate.

FIG. 2 is a first sectional view of substrate 12 as indicated in FIG. 1 illustrating a cross-sectional view of stripline transmission lines formed within substrate 12. As described above, the set of conductive traces 18 are patterned from the first planar conductive layer formed upon upper surface 20 of substrate 12. Conductive traces 18 are connected to one of two polarities of a source of electrical power (e.g., a positive terminal of a power supply). In the embodiment of FIG. 2, a similar set of conductive traces 22 are patterned from a layer of conductive material formed upon underside surface 24 of substrate 12. Members of the set of the set of conductive traces 22 may also be connected to the positive terminal of the power supply. Substrate 12 also includes a second planar layer of an electrically conductive material 26 formed between the set of conductive traces 18 and underside surface 24 of substrate 12. Second planar conductive layer 26 is connected to the other of the two polarities of the source of electrical power (e.g., a negative or ground terminal of the power supply).

A first planar conductive signal layer 28 is formed between conductive traces 18 and conductive layer 26, and patterned to form conductive signal traces 30. A layer of the dielectric substrate material (e.g., fiberglass-epoxy composite or ceramic material) electrically isolates signal traces 30 from conductive traces 18, and a similar layer of the dielectric material isolates signal traces 30 from conductive layer 26. Signal traces 30 interposed between conductive traces 18 and conductive layer 26 form stripline transmission lines. Such stripline transmission lines are highly desirable in high frequency applications (i.e., at signal frequencies where the propagation delays of signals along the lengths of the signal traces are greater than about one-quarter of the signal rise times) as their impedances are highly predictable and controllable.

A second planar conductive signal layer 32 is formed between conductive layer 26 and conductive traces 22, and patterned to form conductive signal traces 34. Layers of the dielectric substrate material electrically isolate signal traces 34 from conductive layer 26 and conductive traces 22. Signal traces 34 interposed between conductive layer 26 and conductive traces 22 also form desirable stripline transmission lines.

Figure 3A:
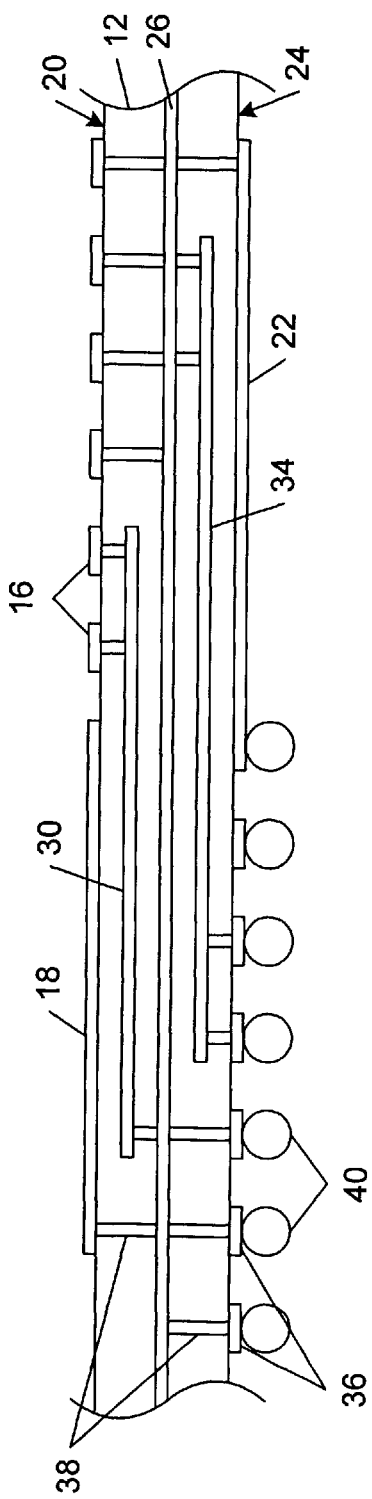
FIG. 3a is a sectional view of the substrate as indicated in FIG. 1 illustrating the stripline transmission lines formed within the substrate along their lengths.

FIG. 3a is a sectional view of substrate 12 as indicated in FIG. 1 illustrating stripline transmission lines formed within substrate 12 along their lengths. Substrate 12 includes a second set of bonding pads 36 arranged upon underside surface 24, preferably in a two-dimensional array. Members of the second set of bonding pads 36 function as terminals of semiconductor device package 10. Conductive traces 18 and 22 are connected between members of the second set of bonding pads 36 and corresponding members of the first set of bonding pads 16 with the help of vertical conductors (i.e., vias) 38. Conductive traces 18 and 22 not only couple the integrated circuit to one terminal of a power supply (e.g., a positive terminal), they also provide reference planes for respective signal traces 30 and 34. Conductive layer 26 is also connected between members of the second set of bonding pads 36 and corresponding members of the first set of bonding pads 16 with the help of vias 38. Conductive layer 26 is continuous, couples the integrated circuit to the other terminal of the power supply (e.g., a negative or ground terminal), and provides a second reference plane for signal traces 30 and 34. Signal traces 30 and 34 are also connected between members of the second set of bonding pads 36 and corresponding members of the first set of bonding pads 16 with the help of vias 38. Signal traces 30 and 34 form stripline transmission line signal paths between members of the second set of bonding pads 36 and corresponding members of the first set of bonding pads 16.

Members of the second set of bonding pads 36 may be coated with solder forming solder balls 40 as shown in FIG. 3a for connecting to corresponding "landing" pads of a printed circuit board ("PCB"). Alternately, members of the second set of bonding pads 36 may have pins extending outwardly therefrom for connecting to a PCB or for inserting into a socket.

In the embodiment heretofore shown and described, the first planar conductive layer formed upon upper surface 20 is "segmented" to form separate conductive traces 18, and second planar conductive layer 26 is continuous (i.e., uninterrupted). It is noted that in other embodiments both the first and second conductive layers may be segmented. It is also noted that a device package employing the present segmented power/ground plane approach is able to support multiple electrical voltage levels without additional dedicated planar conductive layers, and to provide low-inductance signal paths involving those voltage levels. For example, each conductive trace 18 and 22 may be connected to a different power supply voltage. In this case, the associated signal traces are referenced to the corresponding power supply voltage. Further, second planar conductive layer 26 may be patterned (i.e., segmented) to form multiple laterally spaced conductors as indicated in FIG. 2. Each conductor of second planar conductive layer 26 may be connected to a different power supply voltage.

The present segmented power/ground plane approach also allows the same device package to support different integrated circuit die designs having different operational voltage levels (e.g., I/O voltages) similarly routed (i.e., in the same position) on the integrated circuit die and device package. Thus a "generic" device package may be used for many integrated circuit die designs with any combination of I/O voltages without having to redesign the package. In addition, signal traces 30 and 34 may be used to transmit analog and/or digital signals. In this case, the electrical isolation provided by the power/ground plane segments separating signal traces on different elevational levels within the device package is particularly useful.

Figure 3B:
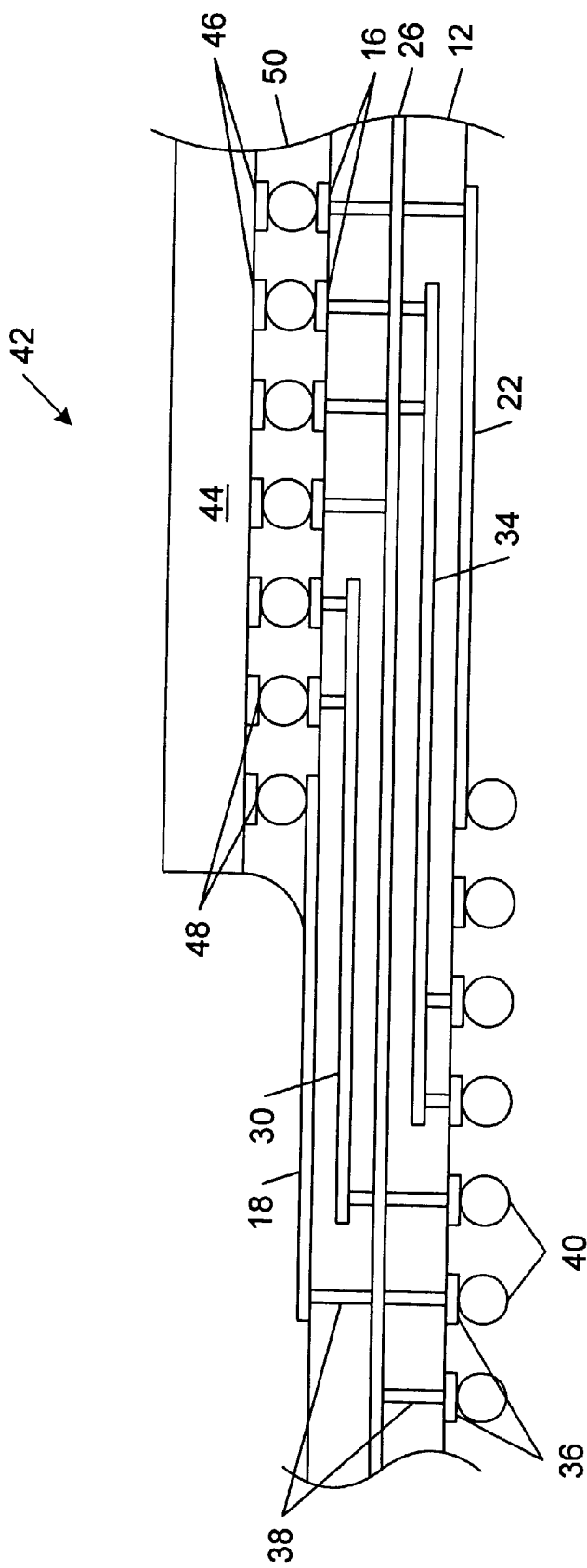
FIG. 3b is a sectional view of the substrate as indicated in FIG. 1, wherein the substrate is part of a semiconductor device which also includes an integrated circuit having input/output (I/O) pads connected to corresponding members of the first set of bonding pads of the substrate.

FIG. 3b is a sectional view of substrate 12 as indicated in FIG. 1, wherein substrate 12 is part of a semiconductor device 42 which also includes an integrated circuit 44 connected to substrate 12 within die area 14 (see FIG. 1). Integrated circuit 44 includes one or more electronic devices formed upon a monolithic semiconductor substrate. Integrated circuit 44 also includes multiple I/O pads 46 at terminal ends of conductors within integrated circuit 44. I/O pads 46 are preferably arranged in a two-dimensional array across an underside surface of integrated circuit 44 and coated with solder forming solder "bumps" 48. Integrated circuit 44 is mounted upon substrate 12 using the controlled collapse chip connection (C4) or "flip chip" method described above.

Members of the first set of bonding pads 16 have substantially the same lateral dimensions (i.e., are approximately the same size) as I/O pads 46 and are configured to align with I/O pads 46. During C4 attachment of integrated circuit 44 to substrate 12, solder bumps 48 are placed in physical contact with corresponding members of the first set of bonding pads 16. Solder bumps 48 are then heated long enough for the solder to flow. When the solder cools, I/O pads 46 are electrically and mechanically coupled to the corresponding members of the first set of bonding pads 16. After integrated circuit 44 is attached to substrate 12, the region between integrated circuit 44 and substrate 12 is filled with an "underfill" material 50 which encapsulates the C4 connections and provides other mechanical advantages.

It will be appreciated by those skilled in the art having the benefit of this disclosure that this invention is believed to be a semiconductor device package having signal traces interposed between power and ground conductors in order to form stripline transmission lines. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A semiconductor device package for housing an integrated circuit and having a substrate comprising:
   a die area defined upon an upper surface of the substrate and dimensioned to receive the integrated circuit;
   a first planar conductive layer formed upon the upper surface, comprising:
      a first set of bonding pads arranged upon the upper surface proximate the die area for making electrical connections to the integrated circuit; and
      a set of conductive traces connected between one of at least two polarities of a source of electrical power and corresponding members of the first set of bonding pads;
   a second planar conductive layer positioned between the first planar conductive layer and an underside surface of the substrate, wherein the second conductive layer is connected to another of said at least two polarities of the source of electrical power; and
   a planar conductive signal layer interposed between the first and second conductive layers and comprising a set of signal traces, wherein the signal traces are positioned between the conductive traces of the first conductive layer and the second conductive layer such that the signal traces form stripline transmission lines.

2. The semiconductor device package as recited in claim 1, further comprising a second set of bonding pads arranged upon the underside surface of the substrate, wherein members of the second set of bonding pads function as device terminals of the semiconductor device package.

3. The semiconductor device package as recited in claim 1, wherein members of the first set of bonding pads are arranged within the die area for C4 electrical connection to the integrated circuit.

4. The semiconductor device package as recited in claim 1, wherein members of the first set of bonding pads are arranged about the die area for wire bonding electrical connection to the integrated circuit.

5. The semiconductor device package as recited in claim 1, wherein the signal layer is isolated from the first conductive layer by a dielectric layer.

6. The semiconductor device package as recited in claim 1, wherein the signal layer is isolated from the second conductive layer by a dielectric layer.

7. The semiconductor device package as recited in claim 1, wherein the second conductive layer comprises a plurality of laterally spaced conductors adapted to receive said at least two polarities of the source of electrical power.

8. The semiconductor device package as recited in claim 1, wherein the substrate comprises an epoxy material.

9. The semiconductor device package as recited in claim 1, wherein the substrate comprises a ceramic material.

10. The semiconductor device package as recited in claim 1, wherein the substrate comprises a polyimide material.

11. The semiconductor device package as recited in claim 2, wherein members of the second set of bonding pads are coated with solder.

12. The semiconductor device package as recited in claim 2, further comprising a set of vias connecting members of the first set of bonding pads to corresponding signal traces and the signal traces to corresponding members of the second set of bonding pads such that signal paths are formed between corresponding members of the first and second sets of bonding pads.

13. An assembly, comprising:
   an integrated circuit having a plurality of input/output (I/O) pads arranged upon a surface;
   a substrate having opposed planar upper and underside surfaces, wherein the substrate comprises:
      a die area defined upon the upper surface and dimensioned to receive the integrated circuit;
      a first planar conductive layer formed upon the upper surface, comprising:
         a first set of bonding pads arranged upon the upper surface proximate the die area for making electrical connections to the integrated circuit; and
         a set of conductive traces connected between one of at least two polarities of a source of electrical power and corresponding members of the first set of bonding pads;

a second planar conductive layer positioned between the first planar conductive layer and an underside surface of the substrate, wherein the second conductive layer is connected to another of said at least two polarities of the source of electrical power; and a planar conductive signal layer interposed between the first and second conductive layers and comprising a set of signal traces, wherein the signal traces are positioned between the conductive traces of the first conductive layer and the second conductive layer such that the signal traces form stripline transmission lines; and wherein the plurality I/O pads of the integrated circuit are electrically connected to corresponding members of the first set of bonding pads.

14. The assembly as recited in claim 13, wherein the integrated circuit comprises at least one electronic device formed upon a monolithic semiconductor substrate.

15. The assembly as recited in claim 13, further comprising a second set of bonding pads arranged upon the underside surface of the substrate, wherein members of the second set of bonding pads function as device terminals of the semiconductor device package.

16. The assembly as recited in claim 13, wherein members of the first set of bonding pads are arranged within the die area and aligned with corresponding members of the plurality of I/O pads of the integrated circuit.

17. The assembly as recited in claim 13, wherein members of the plurality of I/O pads and corresponding bonding pads are connected to retain said integrated circuit upon the substrate.

18. The assembly as recited in claim 13, wherein members of the first set of bonding pads are arranged about the die area and electrically connected to corresponding members of the plurality of I/O pads of the integrated circuit by bonding wires.

19. The assembly as recited in claim 13, wherein the second conductive layer comprises a plurality of laterally spaced conductors adapted to receive said at least two polarities of the source of electrical power.

20. The assembly as recited in claim 13, wherein the substrate comprises an epoxy material.

21. The assembly as recited in claim 13, wherein the substrate comprises a ceramic material.

22. The assembly as recited in claim 13, wherein the substrate comprises a polyimide material.

23. The assembly as recited in claim 15, wherein members of the second set of bonding pads are coated with solder.

24. The assembly as recited in claim 15, further comprising a set of vias connecting members of the first set of bonding pads to corresponding signal traces and the signal traces to corresponding members of the second set of bonding pads such that signal paths are formed between corresponding members of the first and second sets of bonding pads.

* * * * *